(12) United States Patent
Miura et al.

(10) Patent No.: US 11,742,188 B2
(45) Date of Patent: Aug. 29, 2023

(54) SUBSTRATE PROCESSING METHOD, PRESSURE CONTROL APPARATUS AND SUBSTRATE PROCESSING SYSTEM

(71) Applicant: Tokyo Electron Limited, Tokyo (JP)

(72) Inventors: Kazuyuki Miura, Miyagi (JP); Norihiko Amikura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 230 days.

(21) Appl. No.: 16/990,294

(22) Filed: Aug. 11, 2020

(65) Prior Publication Data

US 2021/0050190 A1 Feb. 18, 2021

(30) Foreign Application Priority Data

Aug. 15, 2019 (JP) .................................. 2019-149131
Aug. 3, 2020 (JP) .................................. 2020-131891

(51) Int. Cl.
*H01J 37/32* (2006.01)

(52) U.S. Cl.
CPC .... *H01J 37/32834* (2013.01); *H01J 37/3244* (2013.01); *H01J 2237/335* (2013.01)

(58) Field of Classification Search
CPC ............. C23C 16/4412; H01J 37/3244; H01J 37/32834–32844; H01J 2237/335
See application file for complete search history.

(56) References Cited

U.S. PATENT DOCUMENTS

| 5,575,853 A * | 11/1996 | Arami | C23C 16/4412 118/712 |
| 5,865,205 A * | 2/1999 | Wilmer | G05D 7/0635 73/1.16 |
| 9,404,180 B2 * | 8/2016 | Hara | C23C 16/455 |
| 9,984,907 B2 * | 5/2018 | Haga | A61L 2/14 |
| 2012/0304930 A1 * | 12/2012 | Verdict | C23C 16/4412 55/344 |
| 2014/0182357 A1 * | 7/2014 | Miyauchi | G01M 15/102 73/23.31 |
| 2021/0040619 A1 * | 2/2021 | Yachi | C23C 16/52 |

FOREIGN PATENT DOCUMENTS

| JP | 11300193 A * | 11/1999 |
| JP | 2004-006614 | 1/2004 |
| JP | 2008-192644 | 8/2008 |

* cited by examiner

*Primary Examiner* — Benjamin Kendall
(74) *Attorney, Agent, or Firm* — IPUSA, PLLC (57) ABSTRACT

A substrate processing method is provided. In the method, a process gas is supplied into a chamber. A pressure in the chamber is controlled to a first pressure by evacuating the chamber via a first exhaust line. Then, the pressure in the chamber is controlled to a second pressure that is higher than the first pressure by evacuating the chamber via a second exhaust line while closing the first exhaust line. Next, the pressure in the chamber is controlled to the first pressure by evacuating the chamber via the first exhaust line while closing the second exhaust line.

18 Claims, 4 Drawing Sheets

FIG.1

SUBSTRATE PROCESSING METHOD, PRESSURE CONTROL APPARATUS AND SUBSTRATE PROCESSING SYSTEM

CROSS-REFERENCE TO RELATED APPLICATION

The present application is based on and claims priority to Japanese Priority Application No. 2019-149131 filed on Aug. 15, 2019 and Japanese Priority Application No. 2020-131891 filed on Aug. 3, 2020, the entire contents of which are hereby incorporated herein by reference.

BACKGROUND OF THE INVENTION

1. Field of the Invention

The present disclosure relates to a substrate processing method, a pressure control apparatus and a substrate processing system.

2. Description of the Related Art

For example, Japanese Patent Application Publication No. 2004-6614 proposes a substrate processing apparatus comprising a line for evacuate a gas in a chamber by controlling a pressure in the chamber to a low pressure, and a line for evacuate a gas in the chamber by controlling the pressure in the chamber to a high pressure.

Japanese Patent Application Publication No. 2008-192644 proposes a substrate processing apparatus capable of controlling a high pressure in a chamber and rapidly evacuating a gas in a chamber.

SUMMARY OF THE INVENTION

The present disclosure provides a substrate processing method, a pressure control apparatus and a substrate processing system that can expand a pressure control range in a chamber.

According to one embodiment of the present disclosure, there is provided a substrate processing method using a substrate processing system, the substrate processing system including:

a chamber, a gas supply unit configured to supply a process gas into the chamber, a first exhaust line, and a second exhaust line, wherein the first exhaust line includes a first tube connected to the chamber at one end, a first exhaust device disposed at a first position in the first tube, a first pressure controller disposed between the chamber and the first exhaust device in the first tube, a second exhaust device connected to the other end of the first tube, a first on-off valve disposed between the first exhaust device and the second exhaust device in the first tube, and wherein the second exhaust line includes a second tube connected to the chamber at one end of a second tube having a smaller cross-section area than that of the first tube, a second on-off valve disposed at a second position in the second tube, a second exhaust device connected to the other end of the second tube, a second pressure controller disposed between the second on-off valve and the second exhaust device in the second tube, the substrate processing method comprising steps of:

(a) supplying a process gas into the chamber from the gas supply unit;

(b) controlling a pressure in the chamber to a low pressure by opening the first on-off valve and the first pressure controller, closing the second on-off valve and the second pressure controller and by evacuating the chamber via the first exhaust line by the first exhaust device and the second exhaust device while the first pressure controller controls the pressure in the chamber;

(c) controlling the pressure in the chamber to a high pressure by closing the first on-off valve and the first pressure controller, opening the second on-off valve and the second pressure controller and by evacuating the chamber via the second exhaust line by the second exhaust device while the second pressure controller controls the pressure in the chamber; and (d) switching between the steps (b) and (c).

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

DETAILED DESCRIPTION OF THE PREFERRED EMBODIMENTS

Hereinafter, embodiments of the present disclosure will be described with reference to the drawings. In each drawing, the same components are indicated by the same reference numerals and overlapping descriptions may be omitted.

[Overall Board Processing System Configuration]

Figure 1:
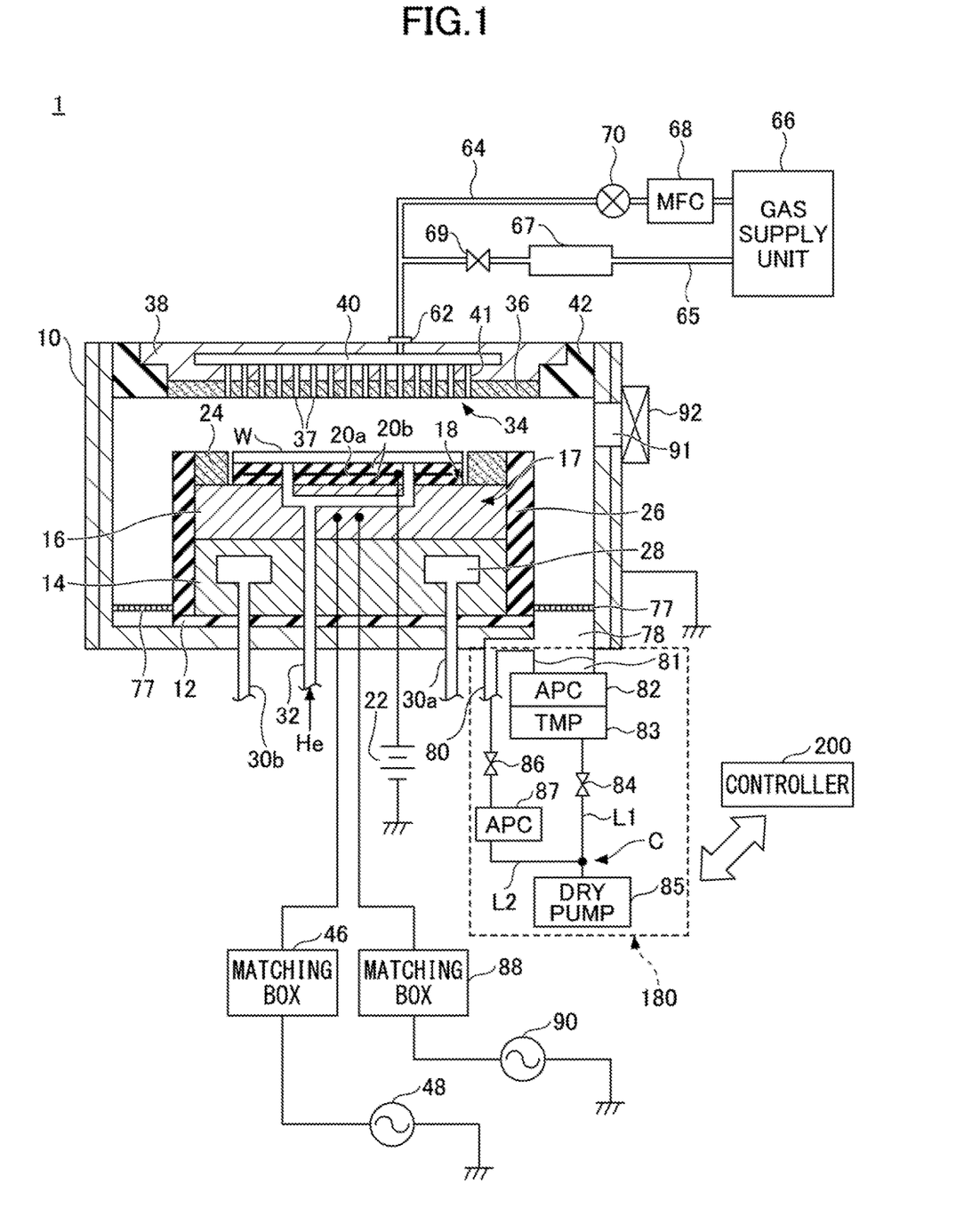
FIG. 1 is a schematic cross-sectional diagram illustrating an example of a substrate processing system according to an embodiment.

First, an example of a substrate processing system according to an embodiment of the present invention will be described with reference to FIG. 1. FIG. 1 is a diagram illustrating an example of a substrate processing system 1 according to an embodiment.

The substrate processing system 1 according to the present embodiment is a capacitively coupled parallel plate substrate processing system, which includes a cylindrical chamber 10 made of, for example, aluminum with an anodized surface. The chamber 10 is grounded.

At the bottom of the chamber 10, a mounting stage 17 is supported by a columnar support platform 14 through an insulating plate 12 made of ceramics and the like. The mounting stage 17 receives a wafer W, which is an example of a substrate. The mounting stage 17 includes an electrostatic chuck 18 and an electrode plate 16. The electrode plate 16 is formed, for example, of aluminum.

The electrostatic chuck 18 that holds the wafer W by electrostatic force is disposed on the top surface of the electrode plate 16. The electrostatic chuck 18 has a structure in which an electrode 20a made of a conductive film is sandwiched between a pair of insulating layers 20b or insulating sheets. A DC power supply 22 is connected to the electrode 20a. The wafer W is adsorbed and held on the electrostatic chuck 18 by electrostatic forces such as coulomb forces produced by DC voltages supplied from the DC power supply 22.

A conductive edge ring 24, which is made of silicon and the like, is disposed around the wafer W to improve etching uniformity. The edge ring 24 is also referred to as a focus ring. A cylindrical inner wall member 26 made of, for example, quartz is disposed on lateral sides of the support platform 14, the electrode plate 16 and the edge ring 24 are provided with.

A refrigerant chamber 28 is disposed, for example, in an annular shape inside the support platform 14. A refrigerant, for example, cooling water, is supplied to the refrigerant chamber 28 at a predetermined temperature from an externally disposed chiller unit via lines 30a and 30b, and circulates in the refrigerant chamber 28. Thus, the temperature of the refrigerant controls the temperature of the wafer W on the platform 17. In addition, a heat transfer gas from the heat transfer gas supply mechanism, for example, He gas, is supplied to a location between the top surface of the electrostatic chuck 18 and the back surface of the wafer W via a gas supply line 32. The refrigerant is an example of a medium for temperature adjustment that is supplied and circulated to the tubes 30a and 30b. The medium for temperature adjustment not only cools but also may heat the mounting stage 17 and the wafer W.

The substrate processing system 1 includes a first radio frequency power supply 48 and a second radio frequency power supply 90. The first radio frequency power supply 48 is a power supply that generates first radio frequency power. The first radio frequency power has a frequency suitable for generating a plasma. The frequency of the first radio frequency power is, for example, a frequency in the range of 27 MHz to 1.00 MHz. The first radio frequency power supply 48 is connected to a lower electrode (mounting stage 17) via a matching box 46 and the electrode plate 16. The matching box 46 includes a circuit for matching the output impedance of the first radio frequency power supply 48 to the impedance of the load side (mounting stage 17 side). The first radio frequency power supply 48 may be connected to a showerhead 34 via the matching box 46. The first radio frequency power supply 48 constitutes an exemplary plasma generator.

The second radio frequency power source 90 is a power source that generates second radio frequency power. The second radio frequency power has a frequency lower than the frequency of the first high frequency power. If the second radio frequency power is used in conjunction with the first radio frequency power, the second radio frequency power is used as the radio frequency power for the bias voltage to draw ions to the substrate W. The frequency of the second radio frequency power is, for example, a frequency in the range of 400 kHz to 13.56 MHz. The second radio frequency power supply 90 is connected to the lower electrode via a matching box 88 and the electrode plate 16. The matching box 88 includes a circuit for matching the output impedance of the second radio frequency power supply 90 to the impedance of the load side.

It should be noted that the second radio frequency power may be used without using the first radio frequency power, that is, only a single high frequency power may be used to generate the plasma. In this case, the frequency of the second radio frequency power may be greater than 13.56 MHz, for example, 40 MHz, and the second radio frequency power supply 90 constitutes an exemplary plasma generator. In this case, the substrate processing system 1 may not include the first radio frequency power supply 48 and the matching box 46.

A showerhead 34 (upper electrode) is provided above the mounting platform 17 opposite to the mounting stage 17. A space between the showerhead 34 and the mounting platform 17 is a processing space in which processes such as etching and film deposition are performed.

The showerhead 34 is supported on top of the chamber 10 via an insulative shielding member 42. The showerhead 34 includes an electrode plate 36 having a plurality of gas discharge holes 37 and an electrode support 38 made of an electrically conductive material, for example, aluminum, with an anodized surface, removably supporting the electrode plate 36. Electrode plate 36 is preferably formed of silicon or SiC. Inside the electrode support 38, a gas diffusion chamber 40 is provided from which many gas flow holes 41 extend downwardly to be in communication with the gas discharge holes 37.

The electrode support 38 includes a gas inlet 62 for directing gas to the gas diffusion chamber 40 to which a gas supply line 64 is connected. A gas supply tube 66, a mass flow controller (MFC) 68, and an open/close valve 70 are connected from the upstream side to the gas supply line 64. The gas is supplied from a gas supply unit 66, and a flow rate and a supply timing are controlled by a mass flow controller 68 and the open/close valve 70. The gas is introduced from the gas supply line 64 through the gas inlet 62 into the gas diffusion chamber 40 and through the gas passage port 41 into the processing space in a shower-like manner from the gas discharge holes 37.

An exhaust port 78 is formed at the bottom of the chamber 10, and the chamber 10 is connected to the pressure controller 180 through the exhaust port 78. An exhaust path to the exhaust port 78 includes an exhaust plate 77 for capturing or reflecting plasma generated in the processing space to prevent leakage to the pressure controller 180. As the exhaust plate 77, an aluminum material coated with a ceramic such as $Y_2O_3$ may be used. A pressure control apparatus 180 controls the pressure in the chamber 10 to a predetermined degree of vacuum. The configuration and operation of the pressure controller 180 will be described later.

The side wall of the chamber 10 includes a transfer port 91 of the wafer W, and the transfer port 91 are opened and closed by a gate valve 92. When performing wafer processing, such as etching, in the substrate processing system 1 of such a configuration, the gate valve 92 is first opened, and the wafer W is carried into the chamber 10 via the transfer port 91 and mounted on the mounting stage 17.

The process gas, such as etching gas, is supplied from the gas supply unit 66 to the gas diffusion chamber 40 at a predetermined flow rate and is supplied into the chamber 10 in a shower-like manner via the gas passage port 41 and the gas discharge hole 37. The pressure control apparatus 180 also evacuates the chamber 10 and controls the chamber to a predetermined pressure.

While introducing the process gas into the chamber 10, the radio frequency power for plasma generation is supplied from the first radio frequency power source 48, and the radio frequency power for ion attraction from the second radio frequency power source 90. Then, a DC voltage is applied from the DC power supply 22 to the electrode 20a to cause the wafer W to be adsorbed to the mounting stage 17. Processing gases supplied into the chamber 10 are converted to plasma by radio frequency power and wafer processing, such as etching, is performed on the wafer W by radicals and ions in the plasma.

The substrate processing system 1 includes a controller 200 for controlling the operation of the entire device. The controller 200 includes a memory, such as a ROM and a RAM, and a CPU. The controller 200 controls wafer processing such as etching and cleaning processing according to a recipe stored in the memory. The recipe includes the process time, pressure (gas exhaust), radio frequency power and voltage, various gas flow rates, chamber temperature (wafer W temperature, electrostatic chuck temperature, and the like), and refrigerant temperature output from the chiller. Incidentally, these programs and recipes indicating wafer processing conditions may be stored on a hard disk or a semiconductor memory. The recipe may also be set in a predetermined position and read out in a portable computer-readable storage medium such as a CD-ROM, a DVD, and the like.

The controller 200 controls the cleaning process according to the cleaning recipe stored in the memory. The cleaning recipe sets the cleaning time, pressure (gas exhaust), DC voltage, gas flow rate, and the like as control information of the equipment for the cleaning process conditions.

[Pressure Control Apparatus]

Next, the configuration and operation of the pressure control apparatus 180 will be described with reference to FIGS. 1 and 2A to 2C. The configuration of the pressure control apparatus 180 in accordance with the present embodiment is shown in FIGS. 1, 2B and 2C. Hereinafter, the configuration of the pressure control apparatus 180 in accordance with the present embodiment will be described in comparison with the conventional pressure control apparatus and configuration shown in FIG. 2A. Thereafter, the operation of the respective pressure control apparatuses will be described.

The pressure controller 180 shown in FIGS. 1 and 2B has a first tube 81 connected at one end to the chamber 10 and a second tube 80 connected at one end to the chamber 10 with a smaller cross-sectional area than that of the first tube 81. The pressure controller 180 also includes a first APC (Adaptive Pressure Control) valve 82, a turbomolecular pump 83 (Turbo Molecular Pump (TMP)), and a first isolation valve 84. The pressure controller 180 further includes a dry pump 85, a second isolation valve 86 and a second APC valve 87.

The turbomolecular pump 83 is disposed in the middle of the first tube 81. The turbomolecular pump 83 is a vacuum pump that evacuates gases and the like within the chamber 10 at high speed. The turbomolecular pump 83 is an example of a first exhaust device. The first exhaust device may be a turbomolecular pump, a mechanical booster pump, or a cryopump.

The first APC valve 82 is disposed between the chamber 10 and the turbomolecular pump 83 in the first tube 81. The first APC valve 82 is in communication with the first tube 81 and controls the pressure within the chamber 10 by adjusting an opening degree of the first tube 81. The first APC valve 82 controls an opening degree of a valving element (adjusting valve) of the first APC valve 82 such that the measured value of the pressure sensor CM1 capable of measuring the pressure within the chamber 10 in a low-pressure range (for, 800 mTorr (107 Pa) or less) becomes a setting value set in the recipe. The first APC valve 82 is an example of a first pressure controller.

The dry pump 85 is connected to the other end of the first tube 81. The dry pump 85 is a vacuum pump that evacuates gases and the like within the chamber 10. The dry pump 85 is an example of a second exhaust device. The second exhaust device may be a dry pump, a mechanical booster pump, and the like.

A first isolation valve 84 is disposed between the turbomolecular pump 83 and the dry pump 85 in the first tube 81. The first isolation valve 84 is an example of a valve capable of controlling the full opening or full closing of the first tube 81. The first isolation valve 84 is an example of the first on-off valve. Hereinafter, the path in which the first APC valve 82, the turbomolecular pump 83, the first isolation valve 84, and the dry pump 85 are disposed in the first tube 81 is referred to as a "first exhaust line L1."

The second tube 80 has a smaller cross-sectional area than that of the first tube 81. For example, the opening diameter of the first tube 81 is about 250 mm and the opening diameter of the second tube 80 is about 30 to 40 mm. The second tube 80 branches from the sidewall of the first tube 81. However, the method of connecting one end of the second tube 80 is not limited thereto, and the end may be connected to another exhaust port that is not illustrated in the drawing and is separately provided at the bottom of the chamber 10. In this embodiment, the other end of the second tube 80 is connected to the first tube 81 at a coupling section C, but is not limited thereto, and may be connected directly to the dry pump 85, while being separated from the first tube 81.

A second isolation valve 86 is disposed at an intermediate location to the second tube 80. The second isolation valve 86 is an example of a valve capable of controlling the full opening or full closing of the second tube 80. The second isolation valve 86 is an example of a second on-off valve. In this embodiment, the first tube 81 and the second tube 80 are coupled to the coupling section C, and are connected to the dry pump 85.

A second APC valve 87 is disposed between the second isolation valve 86 and the dry pump 85 in the second tube 80. The second APC valve 87 adjusts the opening of the second tube 80 with the opening diameter of 30 to 40 mm to control the pressure within the chamber 10. The second APC valve 87 controls the opening of the valving element of the second APC valve 87 such that the measured value of the pressure sensor CM2 capable of measuring the pressure within the chamber 10 in the high-pressure range (800 mTorr or higher) becomes the setting value set in the recipe. The second APC valve 87 is an example of a second pressure controller. Hereinafter, the path in which the second isolation valve 86, the second APC valve 87, and the dry pump 85 are disposed in the second tube 80 is referred to as a "second exhaust line L2."

In the conventional pressure control device illustrated in FIG. 2A, the configuration of the first exhaust line L1 is the same, except that the other exhaust line (hereinafter referred to as an "exhaust line L3") does not have the second APC valve 87. In operation of a conventional pressure control apparatus, to begin with, the second isolation valve 86 of the exhaust line L3 is opened, and the first APC valve 82 and the first isolation valve 84 of the first exhaust line L1 is closed. Under this condition, the dry pump 85 evacuates a gas and the like in the chamber 10 via the exhaust line L3 and depressurizes the chamber 10 from atmospheric pressure to a middle vacuum condition.

Figure 2A:
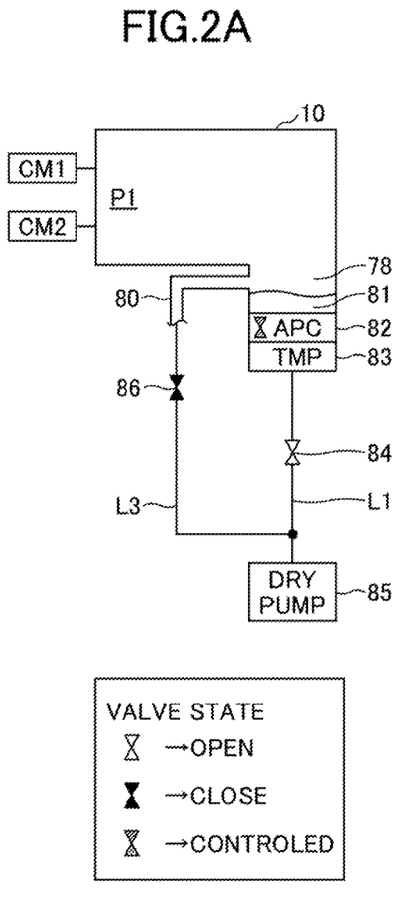
FIGS. 2A to 2C are diagrams illustrating an example of a pressure control apparatus according to an embodiment and an example of a conventional pressure control apparatus.
Figure 2B:
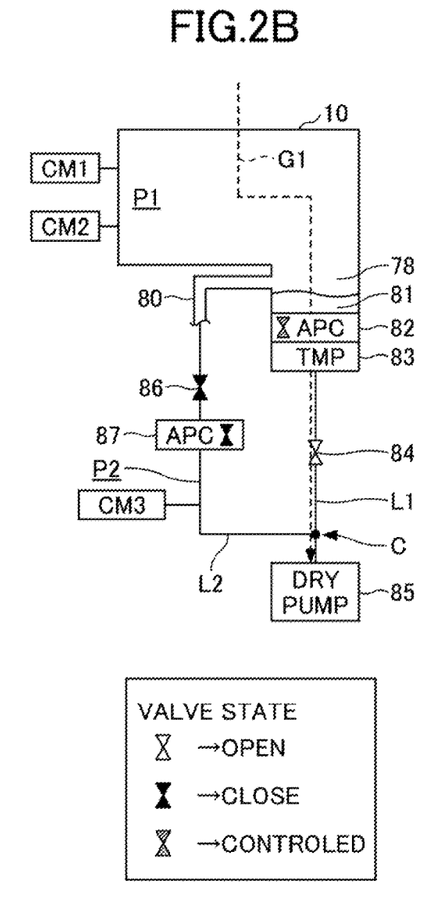
Figure 2C:
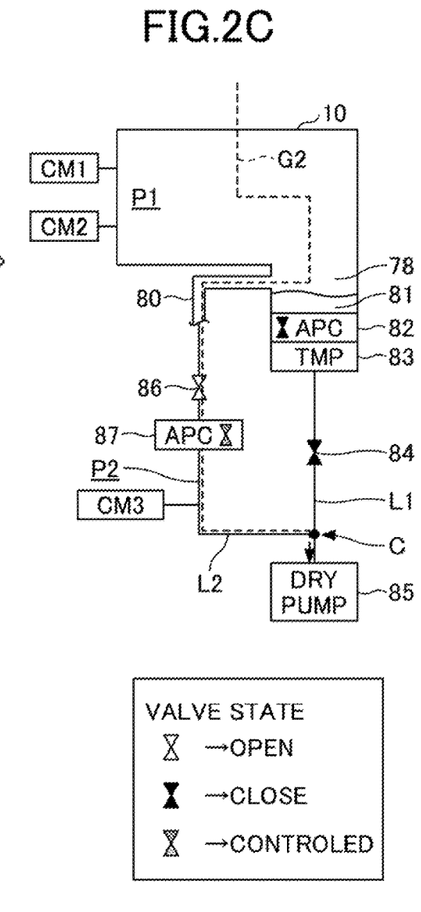

Then, as illustrated in FIG. 2A, the first isolation valve 84 and the first APC valve 82 are opened, and the second isolation valve 86 is closed. In this state, the turbomolecular pump 83, in cooperation with the dry pump 85, evacuates the gas and the like within the chamber 10 from the first exhaust line L1 and depressurizes the chamber 10 to a high vacuum condition lower than the middle vacuum condition. Thus, the pressure in the chamber 10 is controlled so as to decrease to a degree of vacuum of 800 mTorr or less. Control of the pressure in the chamber 10 to a pressure of 800 mTorr or less is hereinafter referred to as "low-pressure control." Controlling the pressure in the chamber 10 to a pressure higher than 800 mTorr is hereinafter referred to as "high-pressure control."

However, the conventional pressure controllers are difficult to control the pressure within the chamber 10 to a high pressure. The reason is that the valving element of the first APC valve 82 adjusts the opening of the first tube 81 having a diameter of about 250 mm, and thus the valve body cannot completely block the opening, and the gas leaks through the gap between the first tube 81 and the first APC valve 82 even if the opening of the valving element is completely closed. For this reason, it is difficult to control the pressure in the chamber 10 to a pressure higher than 800 mTorr. On the other hand, in the pressure control apparatus 180 in accordance with the present embodiment, the second exhaust line L2 is used for the high-pressure control. The valving element of the second APC valve 87 can completely block the opening when the opening of the valving element is controlled to be fully closed to adjust the opening of the second tube 80 with a diameter of about 30 to 40 mm, which is ⅙ to ⅛ of the diameter of the first tube 81. Thus, the pressure in the chamber 10 can be controlled to a pressure greater than 800 mTorr. Hereinafter, specific operations for low-pressure control and high-pressure control will be described, respectively.

[Low-Pressure Control]

In low-pressure control, when the chamber 10 is in a low vacuum condition from atmospheric pressure, the first APC valve 82 and the first isolation valve 84 of the first exhaust line L1 are closed, as illustrated in FIG. 2C, and the first APC valve 87 and the second isolation valve 86 of the second exhaust line L2 are opened. In this state, the dry pump 85 evacuates a gas and the like in the chamber 10 from the second exhaust line L2 and depressurizes the chamber 10 from atmospheric pressure to a middle vacuum condition (rough evacuation). Incidentally, the rough evacuation is not necessarily required in the low-pressure control. For example, when the chamber 10 is in the middle vacuum condition at the beginning of the low-pressure control, such rough evacuation may be omitted.

Thereafter, as illustrated in FIG. 2B, the first APC valve 82 and the first isolation valve 84 of the first exhaust line L1 are opened, and the second APC valve 87 and the second isolation valve 86 of the second exhaust line L2 are closed. In this state, the turbomolecular pump 83, in cooperation with the dry pump 85, evacuates the gas and the like in the chamber 10 from the first exhaust line L1 and reduces the pressure in the chamber 10 to a high vacuum condition lower than the middle vacuum condition (evacuation). In this state, by controlling the opening degree of the valving element of the first APC valve 82, the pressure is controlled to a pressure of 800 mTorr or less in the chamber 10.

The low-pressure control is performed when performing the first process within the chamber 10. The first process is an etching process, a film deposition process, and the like. In the low-pressure control, the pressure in the chamber 10 is controlled below 800 mTorr, but more preferably in the range of 10 mTorr to 800 mTorr (1.33 Pa to 107 Pa).

[High-Pressure Control]

In the meantime, high-pressure control is performed when performing a second process within the chamber 10. The second process includes an ashing process, and a cleaning process. In the case of high-pressure control, as illustrated in FIG. 2C, the first APC valve 82 and the first isolation valve 84 of the first exhaust line L1 are closed, and the second APC valve 87 and the second isolation valve 86 of the second exhaust line L2 are opened. Under this condition, the dry pump 85 evacuates a gas and the like within the chamber 10 via the second exhaust line L2. Under this condition, the opening of the valving element of the second APC valve 87 is controlled and the pressure in the chamber 10 is controlled to a pressure higher than 830 mTorr. In high-pressure control, the pressure in the chamber 10 is controlled to a pressure above 800 mTorr, but more preferably to a pressure in the range of 1 Torr to 100 Torr (133 Pa to 13300 Pa).

It is difficult to control the high pressure in the chamber 10 using the first APC valve 82 while evacuating the gas using the dry pump 85 by stopping the turbomolecular pump 83 in the first exhaust line L. One reason for this is that the opening of the valving element of the first APC valve 82 cannot completely block because, as described above, the opening diameter of the first tube 81 is about 250 mm. Second, because the turbomolecular pump 83 takes about 10 minutes to change from a stopping state to an operational state, or to change from the operational state to the stopping state, stopping or operating the turbomolecular pump 83 reduces the throughput. Thus, it is difficult to perform high-pressure control using the first exhaust line L.

[Switching Control]

The above-described switching between the low-pressure control and the high-pressure control is controlled by the controller 200. Thus, the pressure in the chamber 10 can be controlled to a pressure over a wide range of pressure ranges from 10 mTorr to 100 Torr or more, including a pressure higher than 800 mTorr, which was conventionally difficult. Accordingly, appropriate pressure control can be performed according to the process performed by the substrate processing system 1, and various processes can be performed efficiently and accurately.

The pressure in the chamber 10 is controlled to a pressure set in the recipe depending on a predetermined type of process including processes on a wafer W such as an etching process, a film deposition process, an ashing process, or a chamber cleaning process.

That is, the controller 200 switches between a low-pressure control step in which the evacuation is performed via the first exhaust line L1 illustrated in the gas flow G1 of FIG. 2B and a high-pressure control step in which the evacuation is performed via the second exhaust line L2 illustrated in the gas flow G2 of FIG. 2C according to the next step. This allows the pressure in the chamber 10 to be controlled to a low pressure of 800 mTorr or less or to a pressure higher than 800 mTorr.

In the present embodiment, the pressure in the second APC valve 87 located between the second APC valve 87 and the dry pump 85 and closer to the second APC valve 87 than the coupling section C is made P2, and the pressure in the chamber 10 is made P1.

When switching from the low-pressure control of FIG. 2B to the high-pressure control of FIG. 2C, the controller 200 preferably performs the switching control after performing the following control. That is, the controller 200 determines whether or not the pressure P2 is smaller than the pressure P1 before switching. The pressure P1 is measured by a pressure sensor CM1 and/or a pressure sensor CM2, and a pressure P2 is measured by a pressure sensor CM3. When it is determined that the pressure P2 is smaller than the pressure P1, the controller 200 switches from a low-pressure control in which an evacuation is performed via the first exhaust line L1 to a high-pressure control in which an evacuation is performed via the second exhaust line L2. This prevents the gas from flowing backward from the second tube 80 to the chamber 10. Meanwhile, when it is determined that the pressure P2 is greater than the pressure P1, the controller 200 adjusts the pressure P2 to be smaller than the pressure P1 by closing the second isolation valve 86 and using the second APC valve 87.

It should be noted that switching from the low-pressure control to the high-pressure control may take a considerable amount of time to increase the pressure depending on the gas flow rate supplied into the chamber 10, the volume of the chamber 10 and the setting pressure. In such a case, a tank 67 capable of storing process gas at a predetermined pressure may be connected to the chamber 10, and at the beginning of high-pressure control, a process gas may be supplied into the chamber 10 from the gas supply unit 66 and the tank 67 to increase the pressure in the chamber 10. Alternatively, the gas flow rate of the process gas supplied from the gas supply unit 66 may be increased to a gas flow rate greater than the gas flow rate of the process gas after the chamber 10 pressure reaches the high-pressure control pressure or just before the chamber 10 pressure reaches the control pressure, thereby increasing the pressure in the chamber 10. In addition, these processes may be performed simultaneously. In either case, the period of time to reach the control pressure in the high-pressure control in the chamber 10 can be reduced. FIG. 1 illustrates an example, but not limited to, in which a tank 67 is provided in a bypass gas line 65 branched from a gas supply line 64 and opening and closing of the valve 69 is controlled to supply a process gas from the gas supply unit 66 and the tank 67 into the chamber 10 when switching between a low pressure control and a high pressure control. For example, the bypass gas line 65 may not branch from the gas supply line 64 but may be a separate line capable of supplying gas to the showerhead 34.

[Substrate Processing Method]

Figure 3:
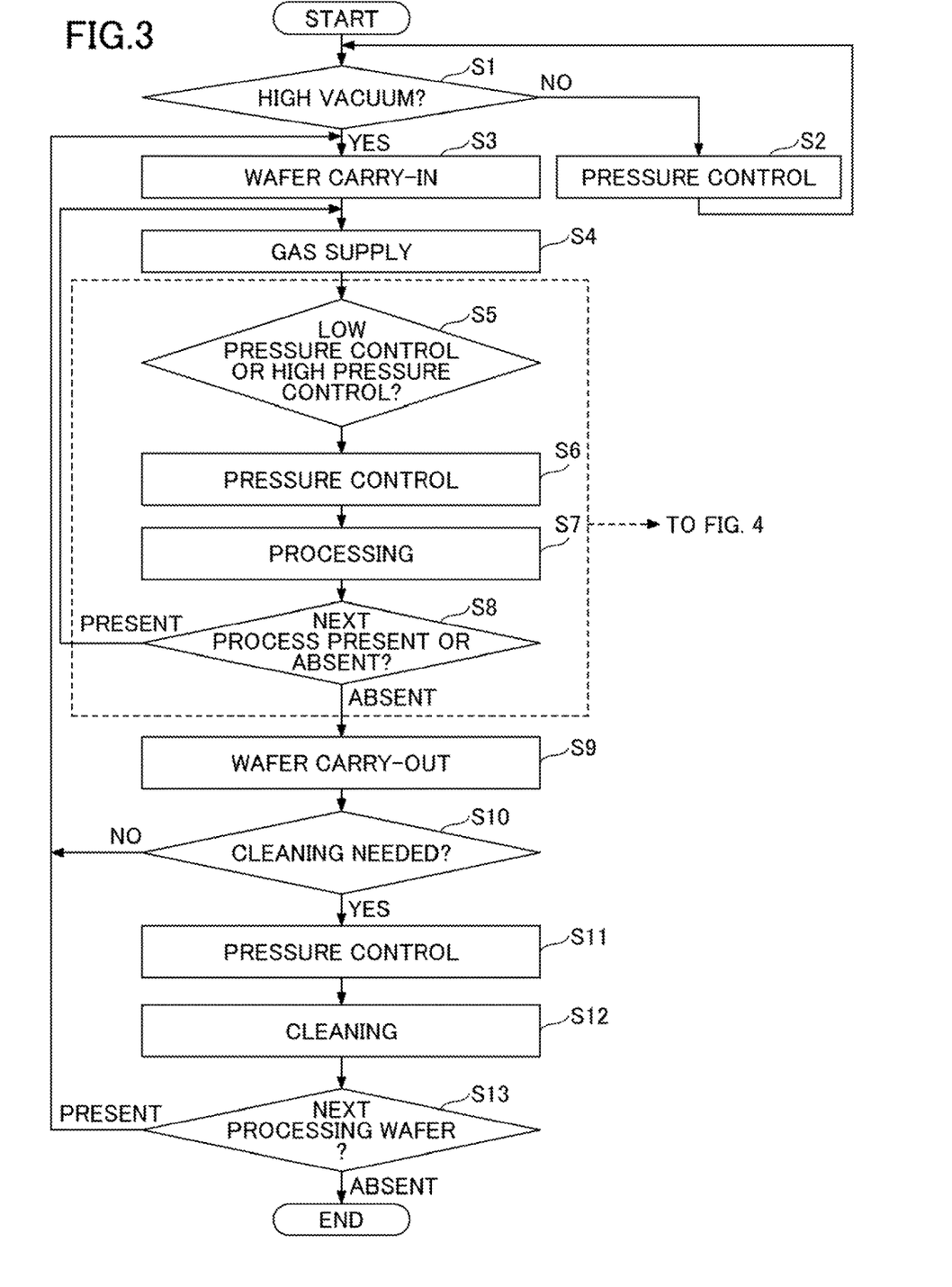
FIG. 3 is a diagram illustrating an example of a substrate processing method according to an embodiment.
Figure 4:
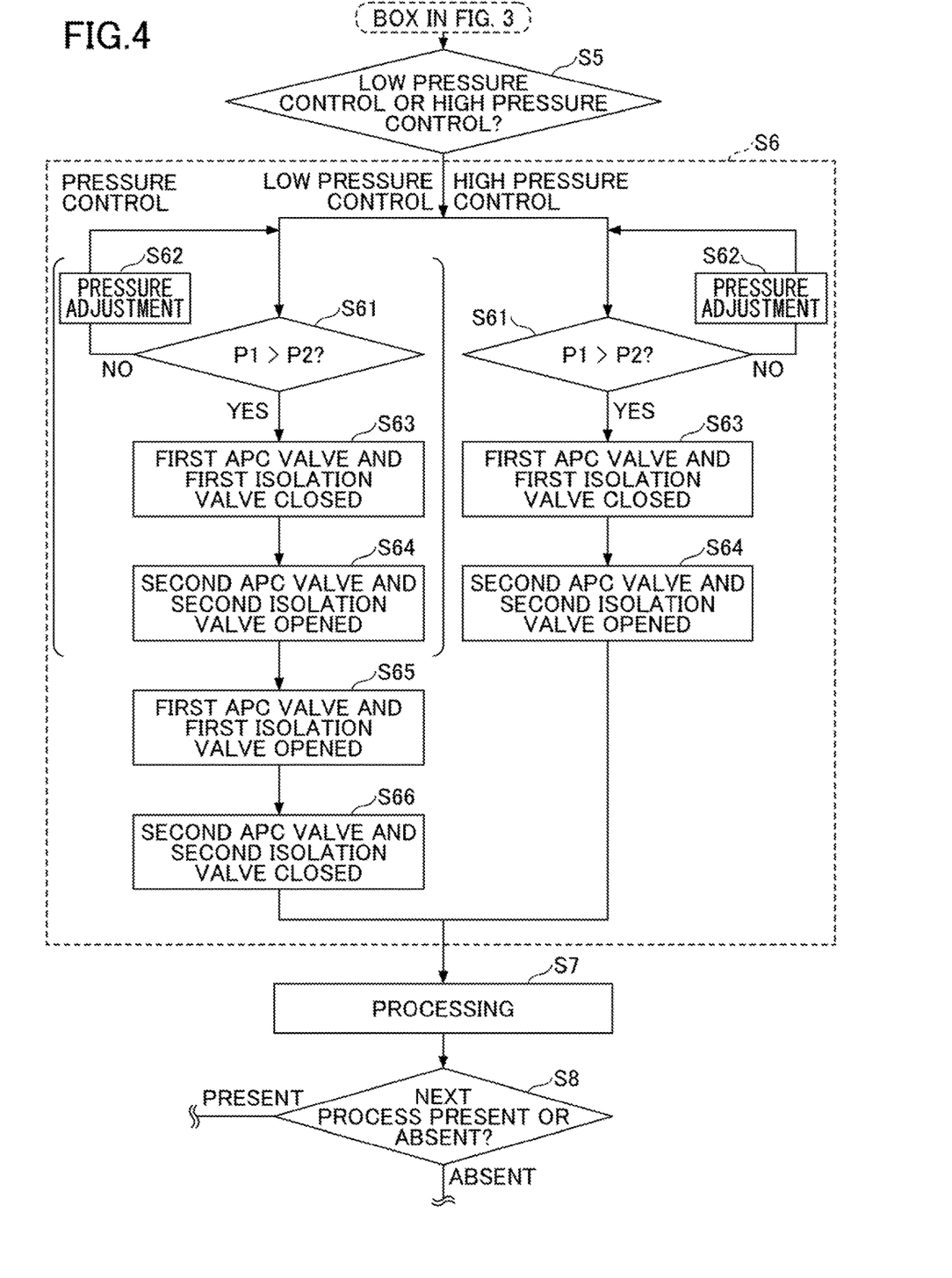
FIG. 4 is a diagram illustrating an example of a specific flow of a substrate processing method according to an embodiment.

Next, an example of a substrate processing method performed by the controller 200 using the pressure control apparatus 180 will be described with reference to FIGS. 3 and 4. FIG. 3 is a diagram illustrating an example of a substrate processing method according to an embodiment. FIG. 4 is a diagram illustrating an example of a specific flow of a substrate processing method according to an embodiment. In the substrate processing method according to the present embodiment, the controller 200 controls the pressure in the chamber 10 of the substrate processing system 1 by operating the pressure control apparatus 180. At the beginning of the process (initial state), the first APC valve 82 and the first isolation valve 84 are opened, and the second APC valve 87 and the second isolation valve 86 are closed.

When the present process is started, the controller 200 first measures the pressure P1 in the chamber 10 using the pressure sensor CM1 and/or the pressure sensor CM2 to determine whether or not the chamber 10 is in a high vacuum (Step S1). As a result of the measurement, when it is determined that the chamber 10 is not in a high vacuum, the controller 200 reduces the pressure in the chamber 10 to a high vacuum condition using the pressure control apparatus 180 (step S2). For example, if the chamber 10 is in a state of a low vacuum from atmospheric pressure, the controller 200 causes the pressure control apparatus 180 to reduce the pressure in the chamber 10 to a high vacuum condition by evacuating the chamber 10 after roughly evacuating the chamber 10. On the other hand, when it is determined that the chamber 10 is in a middle vacuum condition, an evacuation is performed to reduce the pressure to a high vacuum condition without roughly evacuating the chamber 10. After executing Step S2, Step S1 is performed again.

When it is determined in step S1 that the chamber 10 is in a high vacuum, the controller 200 causes the substrate processing apparatus to carry the wafer W into the chamber 10 and to mount the wafer W on the mounting stage 17 (step S3). The controller 200 then causes the substrate processing apparatus to supply a predetermined gas into the chamber 10 (step S4).

Next, in Step S5, the controller 200 determines whether the next process is the process of low-pressure control or the process of high-pressure control based on the recipe. When the first process is performed, the controller 200 determines that the next process is the low-pressure control, and when the second process is performed, the controller 200 determines that the next process is the high-pressure control.

For example, when the first process such as an etching process or a film deposition process is performed, a plasma process such as an etching process is performed on the wafer W using a low-pressure range of 800 mTorr or lower, more preferably 10 mTorr to 800 mTorr. On the other hand, when performing the second process such as a cleaning process or an ashing process, a plasma process is performed using a high-pressure range of 800 mTorr or higher, more preferably 1 Torr to 2 Torr (266 Pa). Accordingly, at the time when the first process and the second process are executed, the rate of the process such as the etch rate and the cleaning rate can be made high, and the efficient process can be executed.

Accordingly, in the case where the next step is the first process, the process proceeds to step S65 of FIG. 4, and the low-pressure control is performed. Meanwhile, in the case where the next step is the second process, the process proceeds to step S63 and the high-pressure control is performed. When the etching process as an example of the first process is switched to the cleaning process as an example of the second process, the opening and closing of each valve of the pressure control apparatus 180 is switched after the wafer W is transferred. When the etching process as an example of the first process is switched to the ashing process as an example of the second process, the opening and closing of each valve of the pressure control apparatus 180 is switched. This switching control is repeated each time the next wafer W is carried in.

In step S5 of FIG. 3, when it is determined that the low-pressure control is performed, the controller 200 opens the first APC valve 82 and the first isolation valve 84 (step S65) and closes the second APC valve 87 and the second isolation valve 86 (step S66). Under this condition, the turbomolecular pump 83, in cooperation with the dry pump 85, evacuates the gas and the like in the chamber 10 via the first exhaust line L1 and controls the opening of the valving element of the first APC valve 82 to decrease the pressure in the chamber 10 to 800 mTorr or lower. Next, the controller 200 causes the substrate processing apparatus 1 to perform predetermined processing based on the recipe (Step S7). When the low-pressure control starts, when the inside of the chamber 10 is in a low vacuum condition from the atmospheric pressure, a rough evacuation is performed in advance, and the pressure in the chamber is reduced to a middle vacuum condition (Step S61 to Step S64), and then the processes of Step S65 and Step S66 are performed.

Meanwhile, the controller 200 determines whether or not the pressure P2 is smaller than the pressure P1 when it is determined that the high-pressure control is performed in Step S5 of FIG. 3 (Step S61). When it is determined that the pressure P2 is higher than the pressure P1, the controller 200 adjusts the pressure P2 to a pressure smaller than the pressure P1 using the second APC valve 87 after closing the second isolation valve 86 (Step S62). Moreover, in order to reduce the period of time when the pressure P2 is adjusted to a pressure smaller than the pressure P1, the process gas may be supplied into the chamber 10 from the gas supply unit 66 and the tank 67 to increase the pressure P1. Then, the process returns to step S61, and the controller 200 again determines whether the pressure P2 is smaller than the pressure P1.

The controller 200 causes the pressure control apparatus 180 to closes the first APC valve 82 and the first isolation valve 84 when it is determined that the pressure P2 is smaller than the pressure P1 (Step 363). The second APC valve 87 and the second isolation valve 86 are also opened (Step S64). Under this condition, the dry pump 85 evacuates a gas and the like in the chamber 10 via the second exhaust line L2, and controls the opening of the valving element of the second APC valve 87 to increase the pressure in the chamber 10 to a pressure above 800 mTorr. Next, the controller 200 causes the substrate processing apparatus 1 to perform the predetermined second process based on the recipe (Step S7).

After the first process or the second process, the controller 200 determines whether or not the next process is present based on the recipe (Step S8). As illustrated in FIG. 3, when it is determined that there is no next step, the controller 200 causes the substrate processing apparatus 1 to carry the wafer W out of the chamber 10 (step S9), and determines whether or not to perform cleaning (step S10). For example, the controller 200 determines whether or not to perform cleaning depending on the number of the processed wafers W and the processing period of time. When the controller 200 determines that the substrate processing system 1 does not perform cleaning, the process returns to Step S3, and the substrate processing system 1 performs predetermined processing for a newly introduced wafer W. Meanwhile, when the controller 200 determines that the substrate processing system 1 performs cleaning, in Step S12, the controller 200 causes the substrate processing system 1 to perform cleaning after controlling the pressure inside the chamber 10 at the high-pressure control by the same flow as Step S61 to Step S64 (Step S11). During cleaning, the dummy wafer may be introduced into the chamber 10 as needed.

After cleaning, the controller 200 determines whether or not the wafer W to be processed next is present (Step S13). When the controller 200 determines that a wafer W to be processed next is present, the process returns to step S3, and the controller 200 causes the substrate processing apparatus 1 to perform predetermined processing for the newly introduced wafer W. Meanwhile, when the controller 200 determines that a wafer W to be processed next is absent, the controller 200 ends the process.

As described above, according to the substrate processing method of the present embodiment, a specific process such as a cleaning process (second process) is performed using a high-pressure range (800 mTorr or more) that is used in the low-pressure range (800 mTorr or less) in the normal wafer processing. For example, in the case where the cleaning process is performed after the etching process, the exhaust line is switched from the first exhaust line L1, which is a gas line in the low-pressure range, to the second exhaust line L2, which is a gas line in the high-pressure range, and the inside of the chamber 10 is switched from the low-pressure control to the high-pressure control. Thus, the pressure control range can be expanded and appropriate pressure control can be performed depending on the process.

The substrate processing method, pressure controller, and substrate processing system according to some embodiments disclosed herein are to be considered exemplary in all respects and are not limited. The above embodiments may be modified and modified in various forms without departing from the appended claims and spirit thereof. The matters described in the above embodiments may take other configurations to the extent not inconsistent, and may be combined to the extent not inconsistent.

For example, in the substrate processing method according to the above-described embodiment, an ashing step and a cleaning step have been described as examples of the second processing performed by the high-pressure control, but this is not limited thereto. The high-pressure control can also be used in certain cleaning steps, for example, in a high-pressure range of one Torr or greater, where a gas is supplied at a high flow rate without using plasma to peel off particles in the chamber.

In this cleaning step, for example, $N_2$ gas is controlled to a large flow rate of 1000 sccm or more to be supplied into the chamber 10, and shock waves are generated in the chamber 10 to cause the particles in the chamber 10 to peel off by the shock waves. Because a pressure of 800 mTorr or less is in a molecular flow range, it is difficult to peel the particles, while a pressure of one Torr or more is in a viscous flow range, making it easier to peel the particles than the molecular flow range. Thus, high-pressure control is also suitable for cleaning steps in which plasma is not used and a gas is supplied at a high flow rate to peel particles in the chamber.

The substrate processing system of the present disclosure can be applied to any of the following types of apparatuses: Atomic Layer Deposition (ALD) apparatus, Capacitively Coupled Plasma (CCP), Inductively Coupled Plasma (ICP), Radial Line Slot Antenna (RLSA), Electron Cyclotron Resonance Plasma (ECR), and Helicon Wave Plasma (HWP).

Thus, as discussed above, according to the embodiments of the present disclosure, a substrate processing method, a pressure control apparatus and a substrate processing system can be provided that can expand a pressure control range in a chamber.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A substrate processing system, comprising:
a chamber including at least one gas inlet and at least one gas exhaust port;
a gas supply unit connected to the gas inlet and configured to supply a process gas into the chamber;
a pressure control apparatus configured to control a pressure within the chamber; and
a controller,
wherein the pressure control apparatus includes a first exhaust line and a second exhaust line,
wherein the first exhaust line includes a first tube connected to the gas exhaust port at one end, a first exhaust device disposed at a first position in the first tube, a first pressure controller disposed between the chamber and the first exhaust device in the first tube, a second exhaust device connected to the other end of the first tube, a first on-off valve disposed between the first exhaust device and the second exhaust device in the first tube, and wherein the second exhaust line includes a second tube connected to the gas exhaust port at one end of a second tube having a smaller cross-section area than that of the first tube, a second on-off valve disposed at a second position in the second tube, the second exhaust device connected to the second tube, a second pressure controller disposed between the second valve and the second exhaust device in the second tube, wherein the controller includes a processor and a non-transitory memory, the non-transitory memory storing program instructions configured to:

(a) supply the process gas into the chamber from the gas supply unit;

(b) control the pressure in the chamber to a first pressure by opening the first on-off valve and the first pressure controller, closing the second on-off valve and the second pressure controller and by evacuating the chamber via the first exhaust line by the first exhaust device and the second exhaust device while the first pressure controller controls the pressure in the chamber;

(c) control the pressure in the chamber to a second pressure that is higher than the first pressure by closing the first on-off valve and the first pressure controller, opening the second on-off valve and the second pressure controller and by evacuating the chamber via the second exhaust line by the second exhaust device while the second pressure controller controls the pressure in the chamber; and (d) switch between the (b) and the (c).

2. The substrate processing system as claimed in claim 1, wherein the program instructions are further configured to: measure the pressure in the chamber before the (a).

3. The substrate processing system as claimed in claim 1, wherein the program instructions are further configured to: measure a pressure (P1) in the chamber and a pressure (P2) in the second tube at a third position closer to the second exhaust device than the second pressure controller before the (c); and perform the (c) upon detecting the pressure (P2) is lower than the pressure (P1).

4. The substrate processing system as claimed in claim 3, wherein the pressure control apparatus further includes a first pressure sensor and a second pressure sensor each configured to measure the pressure (P1).

5. The substrate processing system as claimed in claim 3, wherein the pressure control apparatus further includes a third pressure sensor configured to measure the pressure (P2).

6. The substrate processing system as claimed in claim 1, wherein a first process is performed after the (b), and a second process is performed after the (c).

7. The substrate processing system as claimed in claim 6, wherein the first process is an etching process or a film deposition process, and the second process is an aching process or a cleaning process.

8. The substrate processing system as claimed in claim 1, wherein the pressure in the chamber is controlled to 800 mTorr or lower in the (b), and wherein the pressure in the chamber is controlled to a pressure higher than 800 mTorr in the (c).

9. The substrate processing system as claimed in claim 8, wherein the pressure in the chamber is controlled to a pressure in a range from 1 Torr to 100 Torr in the (c).

10. The substrate processing system as claimed in claim 1, further comprising a tank storing the process gas at a predetermined pressure, wherein, in the (d), the program instructions are further configured to increase the pressure in the chamber by supplying the process gas into the chamber from the gas supply unit and the tank in switching from the (b) to the (c).

11. The substrate processing system as claimed in claim 10, wherein the tank is disposed in a bypass gas line of a gas supply line that connects the chamber and the gas supply unit, the bypass gas line being branched from the gas supply line.

12. The substrate processing system as claimed in claim 10, wherein the tank is disposed in a bypass gas line of a gas supply line that connects the chamber and the gas supply unit, the bypass gas line being disposed separately from the gas supply line.

13. The substrate processing system as claimed in claim 1, wherein, in the (d), the program instructions are further configured to increase the pressure in the chamber by making a gas flow rate of the process gas supplied from the gas supply unit higher than a gas flow rate of the process gas after reaching a control pressure in the (b), until the pressure in the chamber reaches the control pressure or right before the pressure in the chamber reaches the control pressure in switching from the (b) to the (c).

14. The substrate processing system as claimed in claim 1, wherein the pressure control apparatus further includes at least one pressure sensor configured to measure the pressure within the chamber.

15. The substrate processing system as claimed in claim 1, wherein a diameter of the second tube is ⅛ or more and ⅙ or less of a diameter of the first tube.

16. The substrate processing system as claimed in claim 1, wherein the other end of the second tube is connected to the first tube at a coupling section.

17. The substrate processing system as claimed in claim 1, wherein the first exhaust device is at least any of a turbomolecular pump, a mechanical booster pump, or a cryopump.

18. The substrate processing system as claimed in claim 1, wherein the second exhaust device is a dry pump or a mechanical booster pump.

* * * * *